(12) United States Patent
Tagaya et al.

(10) Patent No.: US 11,485,234 B2
(45) Date of Patent: Nov. 1, 2022

(54) POWER SUPPLY SYSTEM

(71) Applicant: HONDA MOTOR CO., LTD., Tokyo (JP)

(72) Inventors: Naoto Tagaya, Saitama (JP); Hirokazu Oguma, Saitama (JP); Hiroki Sakamoto, Saitama (JP); Toshihiro Sone, Saitama (JP); Kenta Suzuki, Saitama (JP)

(73) Assignee: HONDA MOTOR CO., LTD., Tokyo (JP)

(*) Notice: Subject to any disclaimer, the term of this patent is extended or adjusted under 35 U.S.C. 154(b) by 219 days.

(21) Appl. No.: 16/893,421

(22) Filed: Jun. 4, 2020

(65) Prior Publication Data
US 2020/0384866 A1    Dec. 10, 2020

(30) Foreign Application Priority Data

Jun. 6, 2019  (JP) .............................. JP2019-105874

(51) Int. Cl.
| | |
|---|---|
| H02P 1/00 | (2006.01) |
| B60L 3/12 | (2006.01) |
| H02M 3/158 | (2006.01) |
| G01R 31/66 | (2020.01) |
| G01R 31/00 | (2006.01) |
| B60L 50/40 | (2019.01) |

(52) U.S. Cl.
CPC ................. *B60L 3/12* (2013.01); *B60L 50/40* (2019.02); *G01R 31/006* (2013.01); *G01R 31/66* (2020.01); *H02M 3/158* (2013.01); *B60L 2210/10* (2013.01)

(58) Field of Classification Search
CPC ........ B60L 3/12; B60L 50/40; B60L 2210/10; G01R 31/66; G01R 31/006; H02M 3/158; H02P 29/024; H02P 29/0241
See application file for complete search history.

(56) References Cited

FOREIGN PATENT DOCUMENTS

| JP | 2007244123 A | 9/2007 |
|---|---|---|
| JP | 2017169311 A | 9/2017 |
| JP | 2019004594 A * | 1/2019 |

* cited by examiner

*Primary Examiner* — Karen Masih
(74) *Attorney, Agent, or Firm* — CKC & Partners Co., LLC

(57) ABSTRACT

A power supply system 1 includes: first power lines (21p, 21n) to which a first battery (B1) is connected; second power lines (31p, 31n) to which a second battery (B2) is connected; a voltage converter (5) which converts voltage; a power converter which converts electric power; a management ECU (71) and converter ECU (73) which operates the voltage converter (5); a smoothing capacitor connected to the first power lines (21p, 21n); and a motor ECU (72) which executes system interruption processing of determining the existence of failure of the contactors (22m, 22s, 32m, 32s) based on a change in voltage of the smoothing capacitor. The management ECU (71) and converter ECU (73) operate the voltage converter (5) so that a state in which the static voltage of the first battery (B1) is higher by at least the determination potential difference than the static voltage of the second battery (B2).

5 Claims, 7 Drawing Sheets

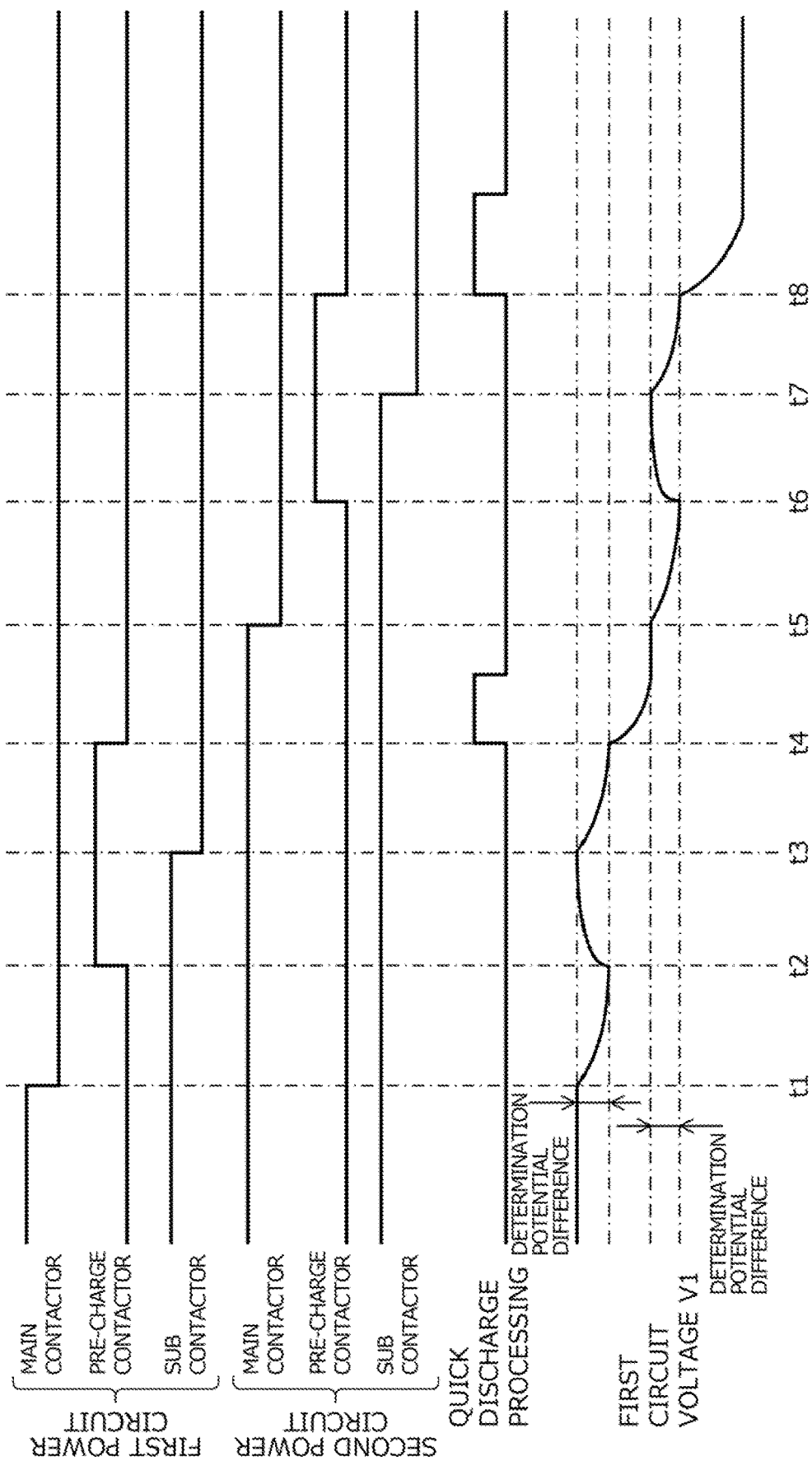

POWER SUPPLY SYSTEM

This application is based on and claims the benefit of priority from Japanese Patent Application No. 2019-105874, filed on 6 Jun. 2019, the content of which is incorporated herein by reference.

BACKGROUND OF THE INVENTION

Field of the Invention

The present invention relates to a power supply system. In more detail, it relates to a power supply system which includes a first power line to which a first electric energy storage device is connected via a first contactor, and a second power line to which a second electric energy storage device is connected via a second contactor, and determines the existence of failure of the first and second contactors during system interruption.

Related Art

In recent years, the development has been active of electric vehicles such as electric transport equipment equipped with a drive motor as a power generation source, and hybrid vehicles equipped with a drive motor and internal combustion engine as power generation sources. In such electric vehicles, an electric energy storage device such as capacitors, batteries and fuel cell for supplying electrical energy to the drive motor is also built in. In addition, in recent years, a vehicle equipped with a plurality of power supply devices having different characteristics in an electric vehicle has also been developed.

Japanese Unexamined Patent Application, Publication No. 2017-169311 shows a power supply system of an electric vehicle equipped with a first power line connecting a first electric energy storage device and a drive unit configured by a drive motor, inverter, etc.; a second power line to which a second electric energy storage device is connected; a voltage converter provided between this first power line and second power line; and a controller which controls switching of this voltage converter. The controller sets the target current for the passing current, which is the electrical current passing through the voltage converter according to a demand from the driver, as well as performing switching control of the voltage converter so that the passing current becomes the target current to synthesize the electric power outputted from the first electric energy storage device and the electric power outputted from the second electric energy storage device.

In addition, these first and second electric energy storage devices are connected to the power lines via contactors to each of the first and second power lines; however, these contactors are determined as whether or not failing, specifically, whether or not these contactors have welding failure, during system interruption (for example, refer to Japanese Unexamined Patent Application, Publication No. 2007-244123).

SUMMARY OF THE INVENTION

With such a power supply system, when turning OFF the contactor connecting the first electric energy storage device and first power line, and breaking the connection between the first electric energy storage device and first power line, since the electrical charge accumulated in the smoothing capacitor provided to the first power line is discharged, the voltage of this smoothing capacitor declines. In contrast, when the contactor becomes ON, the first electric energy storage device and smoothing capacitor are maintained in the connected state; therefore, the voltage of the smoothing capacitor will not decline. The welding determination method of the capacitor in Japanese Unexamined Patent Application, Publication No. 2007-244123 using this determines whether the capacitor has welding failure based on the change in the voltage of the smoothing capacitor after performing operation to turn OFF the capacitor of the first electric energy storage device.

However, in the case of the first power line and the second power line to which the second electric energy storage device is connected being connected via the voltage converter in the aforementioned way, if the voltage of the second electric energy storage device and voltage of the first electric energy storage device are close, since the voltage of the smoothing capacitor is maintained at the voltage of the second electric energy storage device, the voltage of the smoothing capacitor almost does not decline even when turning OFF the capacitor. For this reason, with the capacitor welding determination method shown in Japanese Unexamined Patent Application, Publication No. 2007-244123, it may not be possible to appropriately determine the existence of welding of a contactor.

The present invention has an object of providing a power supply system in which two electric energy storage devices are respectively connected via contactors, which can appropriately determine the existence of failure of a contactor of these electric energy storage devices.

A power supply system (for example, the power supply system 1 described later) according to a first aspect of the present invention includes: first power line to which a first electric energy storage device is connected via a first contactor; a second power line to which a second electric energy storage device is connected via a second contactor; a voltage converter which converts voltage between the first power line and the second power line; a power converter which converts electric power between the first power line and a drive motor; a controller which operates the voltage converter; a capacitor which is connected to the first power line; and a failure determination device which executes failure determination processing of determining the existence of failure of the first contactor and the second contactor based on a change in voltage of the capacitor during system interruption, in which the controller operates the voltage converter so that voltage of the first electric energy storage device becomes higher by at least a predetermined determination potential difference than voltage of the second electric energy storage device, until before the failure determination device starts the failure determination processing at latest.

According to a second aspect of the present invention, in this case, it is preferable for the controller to operate the voltage converter so that a state in which static voltage of the first electric energy storage device is higher by at least the predetermined potential difference than static voltage of the second electric energy storage device is maintained during system operation.

According to a third aspect of the present invention, in this case, it is preferable for an upper limit of a first working range for the static voltage of the first electric energy storage device to be higher than an upper limit of a second working range for the static voltage of the second electric energy storage device; the controller to operate the voltage converter so that more electric power is outputted from the second electric energy storage device than the first electric energy storage device, in a case of the static voltage of the first electric energy storage device becoming no more than a predetermined voltage specified within the first working range, during system operation; and the predetermined voltage to be higher by at least the determination potential difference than the upper limit of the second working range.

According to a fourth aspect of the present invention, in this case, it is preferable for the first electric energy storage device to have a lower output weight density and a higher energy weight density than the second electric energy storage device.

With the power supply system according to the first aspect of the present invention, the first power line to which the first electric energy storage device is connected via the first contactor and the second power line to which the second electric energy storage device is connected via the second contactor are connected by the voltage converter. In addition, the failure determination device determines the existence of failure of the first and second contactors based on a change in voltage of the capacitor connected to the first power line during system interruption. With this power supply system, the first electric energy storage device is connected to the capacitor via the first contactor, and the second electric energy storage device is connected to the capacitor via the second contactor and voltage converter. For this reason, in the case of the potential difference between the voltage of the second electric energy storage device and the voltage of the first electric energy storage device being smaller than the predetermined determination potential difference, since the voltage of the capacitor will not become lower than the voltage of the second electric energy storage device even when turning OFF the first contactor, it is not possible to determine the existence of failure of the first contactor by the failure determination device. Therefore, the controller operates the voltage converter so that the voltage of the first electric energy storage device becomes higher by at least the determination potential difference than the voltage of the second electric energy storage device, until before the failure determination device starts failure determination processing during system interruption at latest. Upon starting the failure determination processing, since it is thereby possible to secure the potential difference between the voltage of the first electric energy storage device and the voltage of the second electric energy storage device as at least the determination potential difference, the existence of failure of the first and second capacitors can be appropriately determined by failure determination processing.

With the power supply system according to the second aspect of the present invention, the controller operates the voltage converter so that a state in which the static voltage of the first electric energy storage device is higher by at least the determination potential difference than the static voltage of the second electric energy storage device is maintained during system operation. Since it is thereby possible to always secure the potential difference between the static voltage of the first electric energy storage device and the static voltage of the second electric energy storage device as at least the determination potential difference during system interruption, in a case of a command to interrupt the system is produced, the failure determination processing can be started immediately.

In the power supply system according to the third aspect of the present invention, the second electric energy storage device is connected to the power converter and drive motor via the voltage converter. For this reason, when trying to supply electric power to the power converter and drive motor from the second electric energy storage device, since a loss in the voltage converter occurs, the electric power demanded in the power converter and drive motor is preferably supplied from the first electric energy storage device as much as possible in order to reduce the loss in the power supply system overall. However, if continuously preserving the output of electric power of the second electric energy storage device, the potential difference between the static voltage of the first electric energy storage device and the static voltage of the second electric energy storage device will reduce, and during system interruption, there is concern over no longer being able to appropriately determine the existence of failure of the first and second contactors by the failure determination processing. In contrast, in the power supply system according to the present invention, the controller, in the case of the static voltage of the first electric energy storage device becoming no more than the predetermined voltage specified within the first working range during system operation, operates the voltage converter so that more electric power is outputted from the second electric energy storage device than the first electric energy storage device. In addition, in the power supply system according to the present invention, the above-mentioned predetermined voltage is made at least the determination potential difference higher than the upper limit of the second working range for the static voltage of the second electric energy storage device. Therefore, according to the power supply system of the present invention, when the static voltage of the first electric energy storage device is higher than the predetermined voltage, in the case of the static voltage of the first electric energy storage device becoming no more than the predetermined voltage, while driving the power converter and drive motor by the electric power outputted from the first electric energy storage device so that the loss in the power supply system overall becomes smaller, the voltage converter is operated so that more electric power is outputted from the second electric energy storage device than the first electric energy storage device, so as to be able to always secure the potential difference between the static voltage of the first electric energy storage device and the static voltage of the second electric energy storage device of at least the determination potential difference during system interruption. It is thereby possible to appropriately determine the existence of failure of the first and second contactors by failure determination processing during system interruption, while making the loss of the power supply system overall as small as possible during system operation.

In the power supply system according to the fourth aspect of the present invention, the first electric energy storage device has lower output weight density and higher energy weight density than the second electric energy storage device. In other words, the power supply system uses an electric energy storage device of capacity type as the first electric energy storage device, and uses an electric energy storage device of output type as the second electric energy storage device. In addition, in the power supply system of the present invention, the second electric energy storage device which is of output type is connected to the power converter and drive motor via the voltage converter. With such a power supply system, it is often the case that, during low load travel in which the electric power demanded by the power converter and drive motor is relatively small, the electric power is mainly outputted from the first electric energy storage device while preserving the second electric energy storage device, so that the loss of the power supply system overall becomes as small as possible, and during high load travel in which the electrical output demanded by the power converter and drive motor is relatively large, electric power is outputted from both the first electric energy storage device and second electric energy storage device. In addition, in this case, the charge rate of the second electric energy storage device during system operation is often maintained to be relatively high, so as to be able to output electric power according to the demand from the second electric energy storage device during high load. In this way, with the power supply system, since the charge rate of the second electric energy storage device of output type is maintained relatively high, the static voltage of the second electric energy storage device and the static voltage of the first electric energy storage device tend to approach each other. In contrast, the controller of the present invention operates the voltage converter so that a state in which the static voltage of the first electric energy storage device is at least the determination potential difference higher than the static voltage of the second electric energy storage device is maintained during system operation. It is thereby possible to cause the electric power according to demand to be outputted from the second electric energy storage device during high load, while making the loss of the power supply system overall as small as possible, and further, to appropriately determine the existence of failure of the first and second contactors by failure determination processing during system interruption.

BRIEF DESCRIPTION OF THE DRAWINGS

FIG. 6 is a time chart showing an example of various contactors and changes in voltage realized by the system interruption processing of FIGS. 5A and 5B.

DETAILED DESCRIPTION OF THE INVENTION

Figure 1:
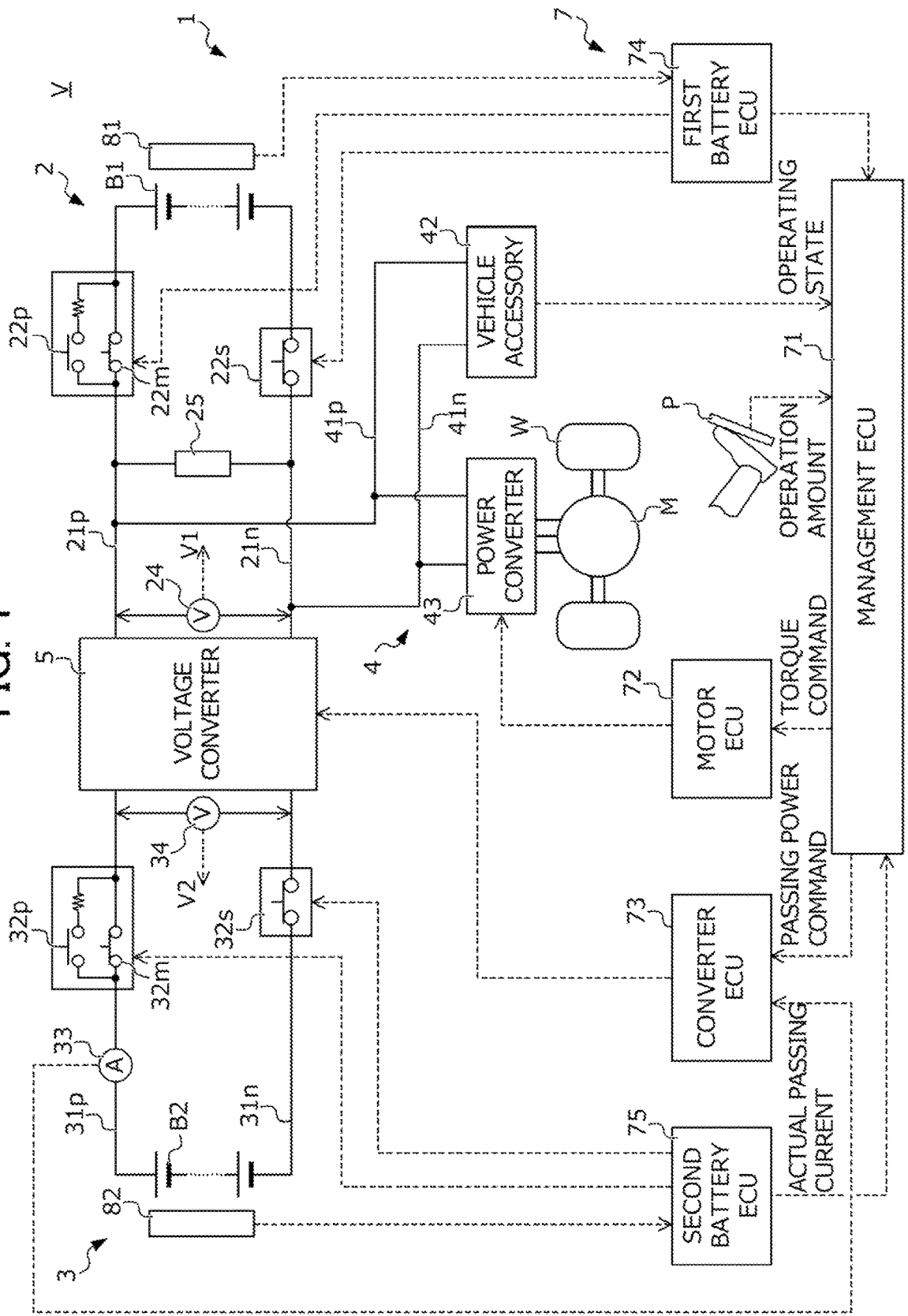
FIG. 1 is a view showing the configuration of a vehicle equipped with a power supply system according to an embodiment of the present invention.

Hereinafter, an embodiment of the present invention will be explained while referencing the drawings. FIG. 1 is a view showing the configuration of an electric vehicle V (hereinafter simply referred as "vehicle") equipped with a power supply system 1 according to the present embodiment.

The vehicle V includes: a drive wheel W; a drive motor M coupled to this drive wheel W; and a power supply system 1 which performs transfer of electric power between this drive motor M and the first battery B1 and second battery B2 described later. It should be noted that the present embodiment explains an example in which the vehicle V accelerates/decelerates by the electric power generated by the drive motor M mainly; however, the present invention is not limited thereto. The vehicle V may be established as a so-called hybrid vehicle equipped with the drive motor M and an engine as power generation sources. In addition, the present embodiment explains as an example the power supply system 1 which travels by supplying electric power stored in the two batteries B1, B2 to the drive motor M; however, the present invention is not limited thereto. Either of the two batteries B1, B2 equipped to the power supply system 1 may be established as a fuel cell.

The drive motor M is joined to the drive wheel W via a power transmission mechanism (not shown). The torque generated by the drive motor M by supplying three-phase alternating current power to the drive motor M from the power supply system 1 is transmitted to the drive wheel W via the power transmission mechanism (not shown) to cause the drive wheel W to rotate and the vehicle V to travel. In addition, the drive motor M exhibits a function of a generator during deceleration of the vehicle V and generates regenerative electric power, as well as applying regenerative braking torque according to the magnitude of this regenerative electric power to the drive wheel W. The regenerative electric power generated by the electric motor M is appropriately charged to the batteries B1, B2 of the power supply system 1.

The power supply system 1 includes: a first power circuit 2 having a first battery B1, a second power circuit 3 having a second battery B2, a voltage converter 5 which connects this first power circuit 2 and second power circuit 3, a load circuit 4 having various electrical loads including the drive motor M, and an electronic control unit group 7 which controls these power circuits 2, 3, 4 and voltage converter 5. The electronic control unit group 7 includes a management ECU 71, a motor ECU 72, a converter ECU 73, a first battery ECU 74, and a second battery ECU 75, which are each a computer.

The first battery B1 is a secondary battery capable of both discharging which converts chemical energy into electrical energy, and charging which converts the electrical energy into chemical energy. Hereinafter, a case is explained using a so-called lithium-ion battery which performs charging/discharging by the lithium ion migrating between electrodes as this first battery B; however, the present invention is not limited thereto.

A first battery sensor unit 81 for estimating the internal state of the first battery B1 is provided to the first battery B1. The first battery sensor unit 81 detects a physical quantity required in order to acquire the charging rate of the battery B1 (value expressing the charged amount of the battery by percentage), the temperature, etc. in the first battery ECU 74, and is configured by a plurality of sensors which send signals according to the detection value to the first battery ECU 74. More specifically, the first battery sensor unit 81 is configured by a voltage sensor that detects the terminal voltage of the first battery B1, a current sensor that detects the electrical current flowing in the first battery B1, a temperature sensor that detects the temperature of the first battery B1, etc.

The second battery B2 is a secondary battery capable of both discharging that converts chemical energy into electrical energy, and charging that converts electrical energy into chemical energy. Hereinafter, a case is explained using a so-called lithium-ion battery which performs charging/discharging by the lithium ion migrating between electrodes as this second battery B2; however, the present invention is not limited thereto. The second battery B2 may use capacitors, for example.

A second battery sensor unit 82 for estimating the internal state of the second battery B2 is provided to the second battery B2. The second battery sensor unit 82 detects a physical quantity required for acquiring the charge rate, temperature, etc. of the second battery B2 in the second battery ECU 74, and is configured by a plurality of sensors which send signals according to the detection value to the second battery ECU 75. More specifically, the second battery sensor unit 82 is configured by a voltage sensor that detects terminal voltage of the second battery B2, a current sensor that detects the electrical current flowing in the second battery B2, a temperature sensor that detects the temperature of the second battery B2, etc.

Herein, the characteristics of the first battery B1 and the characteristics of the second battery B2 are compared. The first battery B1 has lower output weight density and higher energy weight density than the second battery B2. In addition, the first battery B1 has larger capacity than the second battery B2. In other words, the first battery B1 is superior to the second battery B2 in the point of energy weight density. It should be noted that energy weight density is the electric energy per unit weight (Wh/kg), and the output weight density is the power per unit weight (W/kg). Therefore, the first battery B1 which excels in the energy weight density is a capacitive electric energy storage device with the main object of high capacity and the second battery B2 which excels in output weight density is an output-type electric energy storage device with the main object of high output. For this reason, the power supply system 1 uses the first battery B1 as the main power source, and uses the second battery B2 as an auxiliary power source which supplements the first battery B1.

Figure 2:
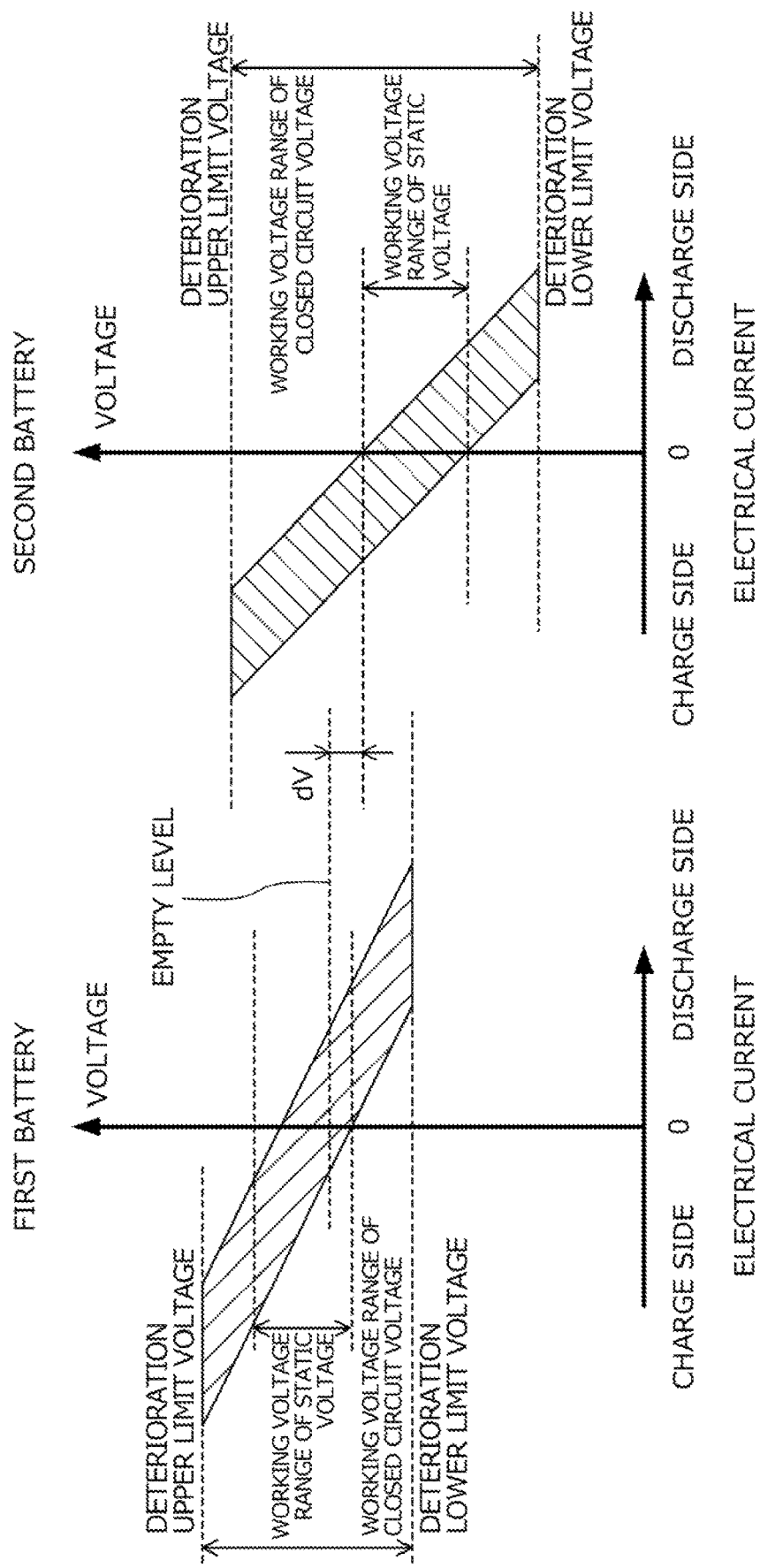
FIG. 2 provides graphs comparing the working voltage ranges of a first battery and a second battery.

FIG. 2 provides graphs comparing the working voltage range of the first battery B1 and second battery B2 in the power supply system 1. In FIG. 2, the left side is a graph showing the working voltage range of the first battery B1, and the right side is a graph showing the working voltage range of the second battery B2. In FIG. 2, the horizontal axis shows the electrical current flowing in the battery, and the vertical axis shows the voltage of the battery.

As shown in FIG. 2, the static voltage of the batteries B1, B2 (i.e. voltage in a state in which electrical current is not flowing to the battery, referred to as open circuit voltage) has a characteristic of rising with higher charge rate. Therefore, the upper limit of the working voltage range relative to the static voltage of the batteries B1, B2 is the static voltage of each when the charge rate is the maximum value (e.g., 100%), and the lower limit is the static voltage of each when the charge rate is the minimum value (e.g., 0%). As shown in FIG. 2, the upper limit value of the working voltage range for the static voltage of the first battery B1 is higher than the upper limit of the working voltage range for the static voltage of the second battery B2. For this reason, the static voltage of the second battery B2 during travel of the vehicle V is basically maintained lower than the static voltage of the first battery B1.

As shown in FIG. 2, the closed circuit voltages of the batteries B1, B2 (i.e. voltage in a state in which electrical current is flowing to the battery) also have a characteristic of rising as the charge rate increases. In addition, since an internal resistance exists in the batteries B1, B2, this closed circuit voltage lowers from the static voltage as the discharge current increases, and rises from the static voltage as the charge current increases. Therefore, the upper limit of the working voltage range relative to the closed circuit voltage of the batteries B1, B2 is higher than the upper limit of the working voltage range relative to the static voltage of each, and the lower limit becomes lower than the lower limit of the working voltage range relative to the static voltage of each. In other words, the working voltage range relative to the closed circuit voltage of the batteries B1, B2 includes the working voltage range relative to the static voltage of each. As shown in FIG. 2, the working voltage range relative to the closed circuit voltage of the first battery B1 overlaps the working voltage range relative to the closed circuit voltage of the second battery B2.

In addition, since the deterioration of the batteries B1, B2 is accelerated when the charging current becomes too large, the upper limit of the working voltage range relative to the closed circuit voltage of these batteries B1, B2 is decided so that these batteries B1, B2 do not deteriorate. Hereinafter, the upper limit of the use range of the closed circuit voltage of these batteries B1, B2 is also referred to as deterioration upper limit voltage.

In addition, when the discharge current becomes too large, since deterioration of the batteries B1, B2 is accelerated, the lower limit of the working voltage range relative to the closed circuit voltage of these batteries B1, B2 is decided so that these batteries B1, B2 do not deteriorate. Hereinafter, the lower limit of the working voltage range relative to the closed circuit voltage of these batteries B1, B2 is also referred to as deterioration lower limit voltage.

In addition, with the power supply system 1, due to using the first battery B1 as the main power source, in the case of the static voltage thereof becoming no more than the empty level set as a level somewhat higher than the lower limit in the working voltage range for static voltage of the first battery B1, a charging lamp (not shown) is illuminated for prompting external charging of the first battery B1 to the driver. It should be noted that, as shown in FIG. 2, this empty level is set to a level higher by a potential difference dV than the upper limit of the working voltage range for the static voltage of the second battery B2. In addition, this potential difference dV is set so as to be at least a determination potential difference referenced in the system interruption processing (refer to FIGS. 5A and 5B) described later. Therefore, while at least the static voltage of the first battery B1 is at least the empty level, it is possible to ensure a potential difference which is at least the determination potential difference between the static voltage of the first battery B1 and the static voltage of the second battery B2.

Referring back to FIG. 1, the first power circuit 2 includes: the first battery B1; first power lines 21*p*, 21*n* which connect both positive and negative poles of this first battery B1 and the positive terminal and negative terminal on the high-voltage side of the voltage converter 5; a main contactor 22*m* provided to the first power line 21*p*; a sub-contactor 22*s* provided to the first power line 21*n*; a first circuit voltage sensor 24 connected between the first power lines 21*p*, 21*n*; and a discharge resistor 25 connected between the first power lines 21*p*, 21*n*.

The contactors 22*m*, 22*s* are normal open type which opens in a state in which a command signal from outside is not being inputted and breaks conduction between both electrodes of the first battery B1 and the first power lines 21*p*, 21*n*; and closes in a state in which a command signal is being inputted and connects the first battery B1 and first power lines 21*p*, 21*n*. These contactors 22*p*, 22*n* open/close according to a command signal transmitted from the first battery ECU 74. It should be noted that the pre-charge contactor 22*p* having a pre-charge resistance for mitigating the inrush current to a plurality of smoothing capacitors provided to the first power circuit 2, load circuit 4, etc., is connected to the first power line 21*p* so as to be parallel with the main contactor 22*m*.

The first circuit voltage sensor 24 sends a detection signal according to the voltage of the first power circuit 2, i.e. value of the potential difference between the first power lines 21*p*, 21*n*, to the contactor ECU 73. It should be noted that, in the present embodiment, the voltage of the first power circuit 2 detected by the first circuit voltage sensor 24 is referred to as first circuit voltage, and noted as "V1".

The second power circuit 3 includes: the second battery B2; second power lines 31p, 32n which connect both positive and negative poles of this second battery B2 and the positive terminal and negative terminal on the low-voltage side of the voltage converter 5; a main contactor 32m provided to the second power line 31p; a sub-contactor 32s provided to the second power line 31n; a current sensor 33 provided to the second power line 31p; and a second circuit voltage sensor 34 connected between the second power lines 31p, 31n.

The contactors 32m, 32s are normal-open type which open in a state in which a command signal from outside is not being inputted to break conduction between both electrodes of the second battery B2 and the second power lines 31p, 31n, and close in a state in which a command signal is being inputted to connect between the second battery B2 and the second power lines 31p, 31n. These contactors 32m, 32s open/close in response to a command signal transmitted from the second battery ECU 75. It should be noted that the pre-charge contactor 32p having pre-charge resistance mitigating the inrush current to a plurality of smoothing capacitors provided to the first power circuit 2, load circuit 4, etc. is connected to the second power line 31p so as to be parallel with the main contactor 32m.

The electric current sensor 33 sends a detection signal according to a value of passing current, which is the electrical current flowing through the second power line 31p, i.e. electrical current flowing through the voltage converter 5, to the converter ECU 73. It should be noted that, in the present embodiment, the direction of passing current defines from the second power circuit 3 side to the first power circuit 2 side as positive, and defines from the first power circuit 2 side to the second power circuit 3 side as negative. Therefore, in the present embodiment, a passing current acquisition means is configured by the current sensor 33.

The second circuit voltage sensor 34 sends a detection signal according to the voltage of the second power circuit 3, i.e. potential difference between the second power lines 31p, 32n, to the converter ECU 73. It should be noted that, in the present embodiment, the voltage of the second power circuit 3 detected by the second circuit voltage sensor 34 is referred to as second circuit voltage, and is noted as "V2".

The load circuit 4 includes: a vehicle accessory 42, output converter 43 to which the drive motor M is connected, and load power lines 41p, 41n which connect this vehicle accessory 42 and output converter 43 with the first power circuit 2.

The vehicle accessory 42 is configured by a plurality of electrical loads such as a battery heater, air compressor, DC/DC converter, and onboard charger. The vehicle accessory 42 is connected to the first power lines 21p, 21n of the first power circuit 2 by the load power lines 41p, 41n, and operates by consuming the electric power of the first power lines 21p, 21n. The information related to the operating state of various electrical loads constituting the vehicle accessory 42 is sent to the management ECU 71, for example.

The power converter 43 is connected to the first power lines 21p, 21n so as to be parallel with the vehicle accessory 42, by the load power lines 41p, 41n. The power converter 43 converts the electric power between the first power lines 21p, 21n and the drive motor M. The power converter 43, for example, is a PWM inverter according to pulse width modulation, provided with a bridge circuit configured by bridge connecting a plurality of switching elements (e.g., IGBT), and is equipped with a function of converting between DC power and AC power. The power converter 43 is connected to the first power lines 21p, 21n on the DC I/O side thereof, and is connected to each coil of the U phase, V phase and W phase of the drive motor M at the AC I/O side thereof. The power converter 43 converts the AC power of the first power lines 21p, 21n into three-phase AC power and supplies to the drive motor M, by ON/OFF driving the switching elements of each phase in accordance with a gate drive signal generated at a predetermined timing from a gate drive circuit (not shown) of the motor ECU 72, and converts the three-phase AC power supplied from the drive motor M into DC power and supplies to the first power lines 21p, 21n.

The voltage converter 5 connects the first power circuit 2 and second power circuit 3, and converts the voltage between both circuits 2, 3. A known boost circuit is used in this voltage converter 5.

Figure 3:
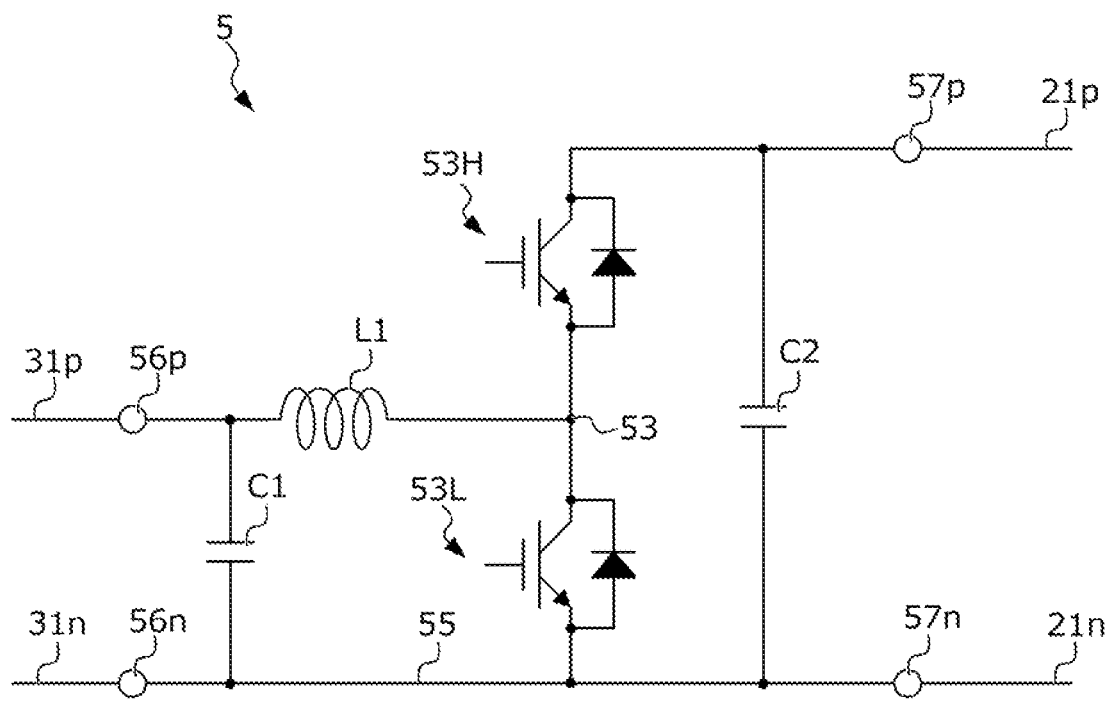
FIG. 3 is a view showing an example of the circuit configuration of a voltage converter.

FIG. 3 is a view showing an example of the circuit configuration of the voltage converter 5. The voltage converter 5 connects the first power lines 21p, 21n to which the first battery B1 is connected, and the second power lines 31p, 31n to which the second battery B2 is connected, and converts the voltage between these first power lines 21p, 21n and second power lines 31p, 31n. The voltage converter 5 is a DC/DC converter configured by combining a first smoothing capacitor C1, second smoothing capacitor C2, high-arm element 53H, low-arm element 53L, negative bus 55, low-voltage side terminals 56p, 56n, and high-voltage side terminals 57p, 57n.

The low-voltage side terminals 56p, 56n are connected to the second power lines 31p, 31n, and the high-voltage side terminals 57p, 57n are connected to the first power line 21p, 21n. The negative bus 55 is wiring connecting the low-voltage side terminal 56n and high-voltage side terminal 57n.

A reactor L has one end side thereof connected to the low-voltage side terminal 56p, and the other end side connected to a connection node 53 between the high-arm element 53H and low-arm element 53L. The first smoothing capacitor C1 has one end side thereof connected to the low-voltage side terminal 56p, and the other end side connected to the low-voltage side terminal 56n. The second smoothing capacitor C2 has one end side thereof connected to the high-voltage side terminal 57p, and the other end side thereof connected to the high-voltage side terminal 57n.

The high-arm element 53H and low-arm element 53L each include a well-known power switching element such as IGBT or MOSFET, and a freewheeling diode connected to this power switching element. This high-arm element 53H and low-arm element 53L are connected in this order in series between the high-voltage side terminal 57p and negative bus 55.

A collector of the power switching element of the high-arm element 53H is connected to the high-voltage side terminal 57p, and the emitter thereof is connected to the collector of the low-arm element 53L. The emitter of the power switching element of the low-arm element 53L is connected to the negative bus 55. The forward direction of the freewheeling diode provided to the high-arm element 53H is a direction from the reactor L towards the high-voltage side terminal 57p. In addition, the forward direction of the freewheeling diode provided to the low-arm element 53L is a direction from the negative bus 55 towards the reactor L.

The voltage converter 5 converts the voltage between the first power lines 21p, 21n and the second power lines 31p, 31n, by alternately driving ON/OFF the high-arm element 53H and low-arm element 53L, following the gate drive signal generated at a predetermined timing from a gate drive circuit (not shown) of the converter ECU 73.

As explained by referencing FIG. 2, the static voltage of the second battery B2 during travel of the vehicle V is basically maintained lower than the static voltage of the first battery B1. Therefore, the voltage of the first power lines 21$p$, 21$n$ is basically higher than the voltage of the second power lines 31$p$, 31$n$. Therefore, the converter ECU 73, in a case of driving the drive motor M using both the power outputted from the first battery B1 and the power outputted from the second battery B2, operates the voltage converter 5 so that a boost function is exhibited in the voltage converter 5. Boost function refers to a function of stepping up the power of the second power lines 31$p$, 31$n$ to which the low-voltage side terminals 56$p$, 56$n$ are connected, and outputting to the first power lines 21$p$, 21$n$ to which the high-voltage side terminals 57$p$, 57$n$ are connected, whereby positive passing current flows from the second power lines 31$p$, 31$n$ side to the first power lines 21$p$, 21$n$ side. In addition, in the case of suppressing discharge of the second battery B2, and driving the drive motor M with only the power outputted from the first battery B1, the converter ECU 73 is configured so as to turn OFF the voltage converter 5, and make so that electrical current does not flow from the first power lines 21$p$, 21$n$ to the second power lines 31$p$, 31$n$. However, in this case, in the case of the voltage of the second power lines 31$p$, 31$n$ becoming higher than the voltage of the first power lines 21$p$, 21$n$, the second battery B2 turns to discharge, and positive passing current may flow from the second power lines 31$p$, 31$n$ to the first power lines 21$p$, 21$n$ via the freewheeling diode of the high-arm element 53H.

In addition, in the case of charging the first battery B1 or second battery B2 by the regenerative electric power outputted from the drive motor M to the first power lines 21$p$, 21$n$ during deceleration, the converter ECU 73 operates the voltage converter 5 so as to exhibit a step-down function in the voltage converter 5. Step-down function refers to a function of stepping down the electric power in the first power lines 21$p$, 21$n$ to which the high-voltage side terminals 57$p$, 57$n$ are connected, and outputting to the second power lines 31$p$, 31$n$ to which the low-voltage side terminals 56$p$, 56$n$ are connected, whereby negative passing current flows from the first power lines 21$p$, 21$n$ side to the second power lines 31$p$, 31$n$ side. In addition, in a case of the voltage converter 5 failing in a state in which the voltage on the first power lines 21$p$, 21$n$ side is higher than the voltage on the second power line 31$p$, 31$n$ side, more specifically, a state of the high-arm element 54H failing ON, negative passing current flows from the first power line 21$p$, 21$n$ side to the second power line 31$p$, 31$n$ side.

Referring back to FIG. 1, the first battery ECU 74 is a computer mainly handling state monitoring of the first battery B1 and the ON/OFF operation of the contactors 22$m$ 22$s$, 22$p$ of the first power circuit 2. The first battery ECU 74, based on a known algorithm using the detection value sent from the first battery sensor unit 81, calculates various parameters representing the internal state of the first battery B1, more specifically, the temperature of the first battery B1, internal resistance of the first battery B1, static voltage of the first battery B, open-circuit voltage of the first battery B1, charge rate of the first battery B1, etc. The information related to the parameters representing the internal state of the first battery B1 acquired in the first battery ECU 74 is sent to the management ECU 71, for example.

The second battery ECU 75 is a computer mainly handling state monitoring of the second battery B2 and open/close operation of the contactors 32$m$, 32$s$, 32$p$ of the second power circuit 3. The second battery ECU 75, based on a known algorithm using the detection value sent from the second battery sensor unit 82, calculates various parameters representing the internal state of the second battery B2, more specifically, the temperature of the second battery B2, internal resistance of the second battery B2, static voltage of the second battery B2, closed-circuit voltage of the second battery B2, charge rate of the second battery B2, etc. The information related to the parameters representing the internal state of the second battery B2 acquired in the second battery ECU 74 is sent to the management ECU 71, for example.

The management ECU 71 is a computer managing mainly the flow of electric power in the overall power supply system 1. The management ECU 71 generates, according to the following sequence, a torque command signal corresponding to a command related to the torque generated by the drive motor M, and a passing power command signal corresponding to a command related to electric power passing through the voltage converter 5.

The management ECU 71, based on the operation amount of pedals such as the accelerator pedal and brake pedal by the driver, calculates the demanded drive torque by the driver, and sends a torque command signal according to this demanded drive torque to the motor ECU 72.

The management ECU 71 calculates a total demanded power, which is the electric power demanded in the load circuit 4 overall, by summing the demanded accessory power, which is the electric power demanded in the vehicle accessory 42, and the demanded drive power, which is the electric power demanded in the drive motor M. Herein, the demanded accessory power is calculated in the management ECU 71, based on information related to the operating state of various electrical loads sent from the vehicle accessory 42. In addition, the demanded drive power is calculated in the management ECU 71, by converting the aforementioned demanded drive torque into electric power.

The management ECU 71 calculates a second load rate corresponding to a proportion of electric power outputted from the second battery B2 relative to the total demanded power, by performing energy management processing using information related to the internal state of the first battery B1 sent from the first battery ECU 74, information related to the internal state of the second battery B2 sent from the second battery ECU 75, and the aforementioned demanded drive power. In addition, the management ECU 71 calculates the second target power, which is the target relative to the electric power outputted from the second battery B2 by multiplying the second load rate calculated by energy management processing by the total demanded power, and sends the passing power command signal according to this second target power to the converter ECU 73.

Next, a summary of energy management processing in the management ECU 71 will be explained while referencing FIG. 4.

Figure 4:
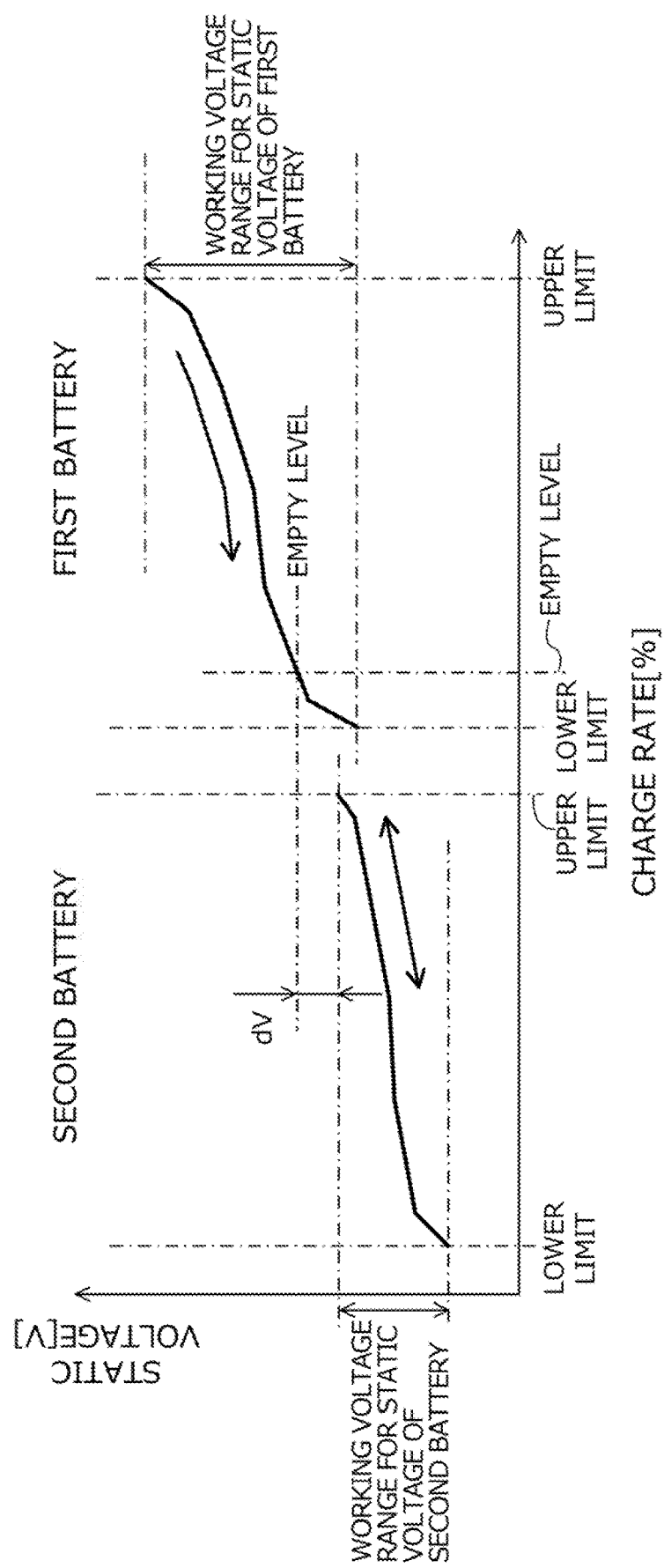
FIG. 4 provides graphs comparing SOC-OCV curves of the first battery and second battery.

FIG. 4 provides graphs comparing SOC-OCV curves of the first battery B1 (right side) and second battery B2 (left side). Herein, the SOC-OCV curve is a curve showing the relationship between the charge rate (horizontal axis) of the respective batteries B1, B2 and the static voltage (vertical axis).

As shown in FIG. 4, a common battery has a characteristic in which the static voltage also declines as the charge rate decreases. Therefore, the upper limit for the charge rate of each of the batteries B1, B2 is the charge rate when the static voltage of each battery B1, B2 is at the upper limit of the working voltage range of each. In addition, the lower limit for the charge rate of each of the respective batteries B1, B2 is the charge rate when the static voltage of the respective batteries B1, B2 is at the lower limit for the working voltage range of each. In addition, as explained by referencing FIG. 2, the empty level decided in the working voltage range for the static voltage of the first battery is higher by the potential difference dV than the upper limit of the working voltage range for the static voltage of the second battery B2, and this potential difference dV is at least the determination potential difference described later. In addition, unless otherwise confusing, the charge rate when the static voltage of the first battery B1 is at the empty level is also considered the empty level.

As mentioned above, the power supply system 1 uses the first battery B1 which is capacitive type as the main power source, and uses the second battery B2 which is output type as an auxiliary power source which compensates this first battery B1. Since the power supply system 1 uses the first battery B1 as the main power source in this way, the charge rate of the first battery B1 basically has a tendency of gradually declining towards the lower limit during system operation. In this regard, the charge rate of the second battery B2 has a tendency of fluctuating up and down more greatly than the first battery B1. Therefore, the management ECU 71 performs energy management divided into a case of the charge rate of the first battery B1 being higher than the empty level, and a case of the charge rate of the first battery B1 being no more than the empty level.

First, a summary of energy management processing is explained in a case of the charge rate of the first battery B1 being higher than the empty level. In this case, the management ECU 71, in the case of being during low load travel and being able to cover the entirety of the total demanded electric power by only the electric power outputted from the first battery B1, the second load rate is basically set as 0% to suppress the output of electric power from the second battery B2. In addition, the management ECU 71, in the case of not being able to cover the entirety of the total demanded electric power by only the electric power outputted from the first battery B1, sets the second load rate to a value greater than 0% so that the deficit thereof is supplemented by the electric power outputted from the second battery B2. In the case of the charge rate of the first battery B being higher than the empty level in this way, the electric power is basically outputted from the second battery B2 only during high load travel. For this reason, the management ECU 71, in the case of being during regenerative travel, sets the second load rate so that the charge rate of the second battery B2 falls within a target charge rate range decided near the upper limit thereof, i.e. so that the generative power is preferentially charged to the second battery B2, so as to meet the demands during high load travel later. In the case of being during system operation and the charge rate of the second battery B1 being higher than the empty level, the static voltage of the first battery B1 thereby gradually declines toward the empty level, and the static voltage of the second battery B2 fluctuates up and down in the vicinity of the upper limit of the working voltage range. It should be noted that, due to the second battery B2 being connected to the power converter 43 and drive motor M via the voltage converter 5, suppressing the output of electric power from the second battery B2 in this way is a logical upon decreasing the loss of the voltage converter 5.

Herein, the empty level for the static voltage of the first battery B1 is higher by the potential difference dV than the upper limit of the working voltage range for the static voltage of the second battery B2. Therefore, during system operation, the voltage converter 5 is operated so that a state in which the static voltage of the first battery B1 is at least higher by the potential difference dV than the static voltage of the second battery B2 is maintained.

Next, a summary of the energy management processing in a case of the charge rate of the first battery B1 being no more than the empty level will be explained. It should be noted that, when the charge rate of the first battery B1 becomes no more than the empty level, the charging lamp illuminates in the aforementioned way. For this reason, it can be considered that the driver rarely demands high load driving in order to suppress consumption of electric power, after the charge rate of the first battery B1 becomes no more than the empty level.

In addition, when the charge rate of the first battery B1 becomes no more than the empty level, it may no longer be possible to ensure a potential difference of at least the potential difference dV between the static voltage of the first battery B1 and the static voltage of the second battery B2. In addition, when it becomes no longer possible to ensure a potential difference of at least the potential difference dV between the static voltage of the first battery B1 and the static voltage of the second battery B2, more specifically, the determination potential difference described later, there is concern over no longer being able to accurately determine failure of the contactors 22m, 22s, 22p, 32m, 32s, 32p, in the system interruption processing shown in FIGS. 5A and 5B described later.

Therefore, the management ECU 71, in the case of the charge rate of the first battery B1 being no more than the empty level, sets the second load rate to a value larger than 50%, more preferably 100%, so that more electric power is outputted from the second battery B2 than the first battery B1. During system operation, since it is thereby possible to accelerate the decline in static voltage of the second battery B2, while suppressing a decline in static voltage of the first battery B1, the voltage converter is operated so that a state in which the static voltage of the first battery B1 is higher by at least the potential difference dV, more specifically, the determination potential difference, than the static voltage of the second battery B2 is maintained.

In addition, the management ECU 71 sets the second load rate to a value smaller than 50%, more preferably 0%, so that more electric power is outputted from the first battery B1 than the second battery B2, after the charge rate of the second battery B2 declines to near the lower limit thereof. Until the charge rate of the first battery B1 reaches the lower limit, it is thereby possible to continue travel while maintaining a state in which the static voltage of the first battery B1 is higher by at least the potential difference dV, more specifically, the determination potential difference, than the static voltage of the second battery B2.

Referring back to FIG. 1, the converter ECU 73 is a computer which handles management of electric power passing through the voltage converter 5. The converter ECU 73, in response to a passing power command signal sent from the management ECU 71, operates the high-arm element 53H and low-arm element 53L of the voltage converter 5 by way of PWM control, so that the passing power according to a command passes through the voltage converter 5. More specifically, the converter ECU 73, based on the passing power command signal, calculates the target current, which is the target relative to the passing current of the voltage converter 5, and decides the duty ratio in accordance with a known feedback control algorithm so that the passing current detected by the current sensor 33 becomes the target current, and inputs a gate drive signal generated under this duty ratio to the high-arm element 53H and low-arm element 53L of the voltage converter 5. The electric power according to the second target power is thereby outputted from the second battery B2 to the first power circuit 2. In addition, a deficit by subtracting the second target power from the total demanded power is outputted from the first battery B1.

Figure 5A:
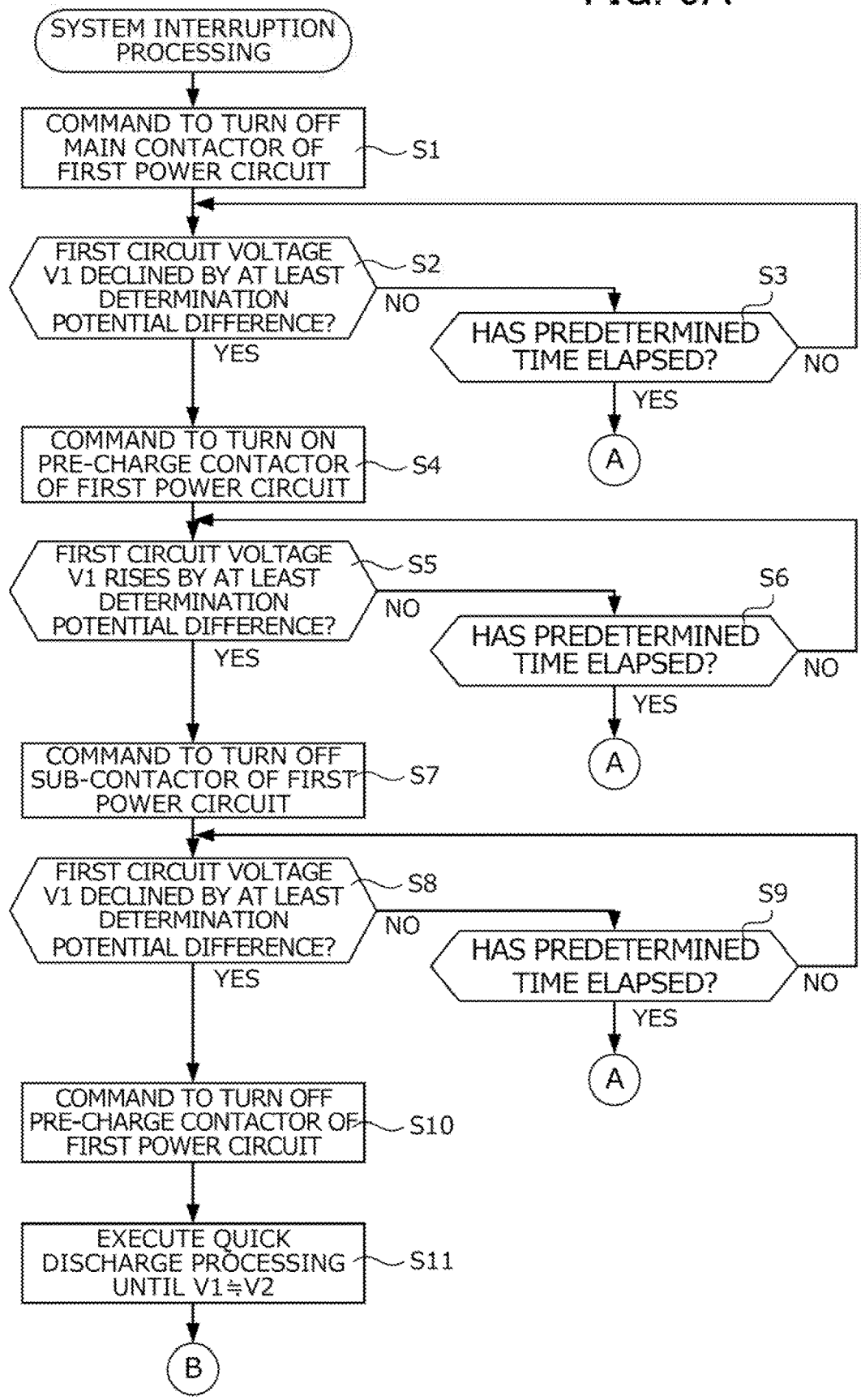
FIG. 5A is a flowchart showing a specific sequence of system interruption processing of a motor ECU.
Figure 5B:
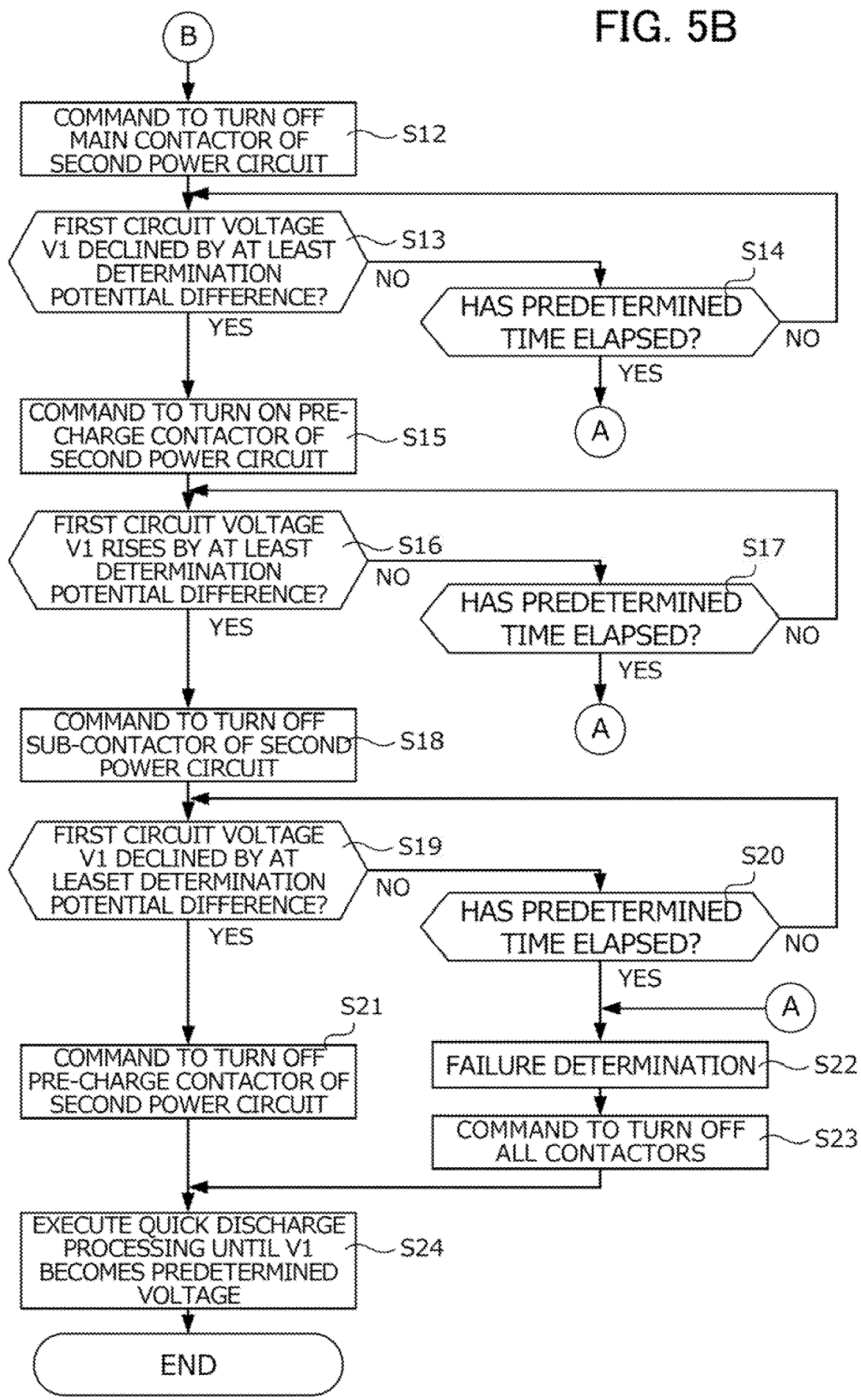
FIG. 5B is a flowchart showing a specific sequence of system interruption processing of the motor ECU.

The motor ECU 72 is a computer which mainly handles management of the flow of electric power from the first power circuit 2 to the drive motor M, and system interruption processing which is explained by referencing FIGS. 5A and 5B along with FIG. 6. The motor ECU 72 operates the power converter 43, based on a torque command signal sent from the management ECU 71, so that torque according to this command is generated in the drive motor M. The electric power according to the demanded drive power is thereby supplied to the drive motor M from the first power circuit 2.

Next, system interruption processing by the motor ECU 72 will be explained while referencing the flowcharts of FIGS. 5A and 5B together with the time chart of FIG. 6.

FIGS. 5A and 5B are flowcharts showing the specific sequences of system interruption processing of the motor ECU 72. The system interruption processing shown in FIG. 5 is executed by the motor ECU 72, in response to a power switch (not shown) being operated to OFF by the driver, and a system interruption command commanding the interruption of the power supply system 1 being produced. FIG. 6 is a time chart showing an example of various contactors and changes in voltage realized by the system interruption processing of FIGS. 5A and 5B.

It should be noted that, during system operation, the main contactor 22m and sub contactor 22s of the first power circuit 2, as well as the main contactor 32m and sub contactor 32s of the second power circuit 3 are maintained ON, and the pre-charge contactor 22p of the first power circuit 2 and the pre-charge contactor 32p of the second power circuit 3 are maintained OFF. For this reason, at the moment when starting the system interruption processing of FIG. 5, these contactors 22m, 22s, 32m, 32s are ON, and the contactors 22p, 32p are OFF.

As shown in FIGS. 5A and 5B, the system interruption processing includes: first contactor failure determination processing of determining the existence of failure of the contactors 22m, 22p, 22s provided to the first power circuit 2 of higher voltage (Steps S1 to S10); second contactor failure determination processing of determining the existence of failure of the contactors 32m, 32p, 32s provided to the second power circuit 3 of lower voltage (Step S12 to S23); and quick discharge processing of decreasing the voltage of the circuits such as the first power circuit 2 and second power circuit 3 (Steps S11 and S24). In addition, FIG. 6 shows a case of these contactors 22m, 22p, 22s, 32m, 32p, 32s all being normal.

First, in Step S1, the motor ECU 72 sends a command to turn OFF the main contactor 22m of the first power circuit 2 to the first battery ECU 4, and then advances the processing to Step S2. The first battery ECU 74 thereby turns OFF the main contactor 22m.

Herein, when the main contactor 22m turns OFF in accordance with the command, the first battery B1 is disconnected from the first power line 21p. In addition, when the first battery B1 is disconnected from the first power line 21p, since the electrical charge of the second smoothing capacitor C2 of the voltage converter 5 (refer to FIG. 3), e.g., is discharged to the discharge resistor 25 (refer to FIG. 1), the first circuit voltage V1 declines as shown at times t1 to t2 of FIG. 6. In addition, in the case of the main contactor 22m not having been turned OFF in accordance with the command, the first circuit voltage V1 almost does not decline. It should be noted that, since the second battery B2 is connected to the second smoothing capacitor C2 via the voltage converter 5, the first circuit voltage V1 will not become lower than the static voltage of the second battery B2. Therefore, during system operation in the above way, since a state in which the static voltage of the first battery B1, i.e. first circuit voltage V1, is higher by at least the potential difference dV, more specifically at least the determination potential difference, than the static voltage of the second battery B2 is maintained, the first circuit voltage V1 declines by at least the determination potential difference from the voltage immediately before turning OFF the main contactor 22m so long as the main contactor 22m is turned OFF in accordance with the command.

In Step S2, the motor ECU 72 determines whether the first circuit voltage V1 declined by at least the determination potential difference from the voltage immediately prior to first turning OFF the main contactor 22m. In the case of the determination result of Step S2 being NO, the motor ECU 72 advances the processing to Step S3. In Step S3, the motor ECU 72 determines whether a predetermined time has elapsed since first turning OFF the main contactor 22m. In the case of the determination result of Step S3 being NO, the motor ECU 72 returns the processing to Step S2.

In the case of the determination result of Step S3 being YES, i.e. the case of the first circuit voltage V1 not declining by the determination potential difference even when a predetermined time elapsed, the motor ECU 72 advances the processing to Step S22, determines that the main contactor 22m has welding failure, and advances the processing to Step S23. In addition, in Step S23, the motor ECU 72 advances the processing to Step S24 after turning OFF all of the remaining contactors.

In the case of the determination result of Step S2 being YES, i.e. case of the first circuit voltage V1 declining by at least the determination potential difference before the predetermined time elapsed, the motor ECU 72 determines that the main contactor 22m is normal, more specifically, the main contactor 22m does not have welding failure, and then advances the processing to Step S4.

In Step S4, the motor ECU 72 sends a command to turn ON the pre-charge contactor 22p of the first power circuit 2 to the first battery ECU 74, and then advances the processing to Step S5. The first battery ECU 74 thereby turns ON the pre-charge contactor 22p.

Herein, when the pre-charge contactor 22p turns ON in accordance with the command, the first battery B1 is connected to the first power line 21p again. In addition, when the first battery B1 is connected to the first power line 21p, since the second smoothing capacitor C2 of the voltage converter 5 is charged, the first circuit voltage V1 rises as shown at times t2 to t3 of FIG. 6. In addition, in the case of the pre-charge contactor 22p not turning OFF in accordance with the command, the first circuit voltage V1 almost does not rise.

In Step S5, the motor ECU 72 determines whether the first circuit voltage V1 has risen by at least the determination potential difference from the voltage immediately before first turning ON the pre-charge contactor 22p. In the case of the determination result of Step S5 being NO, the motor ECU 72 advances the processing to Step S6. In Step S6, the motor ECU 72 determines whether a predetermined time has elapsed since first turning ON the pre-charge capacitor 22p.

In the case of the determination result of Step S6 being NO, the motor ECU 72 returns the processing to Step S5.

In the case of the determination result of Step S6 being YES, i.e. case of the first circuit voltage V1 not rising by at least the determination potential difference even when a predetermined time elapsed, the motor ECU 72 advances the processing to Step S22, it is determined that the pre-charge capacitor 22p has disconnect failure, and then advances the processing to Step S23. In addition, in Step S23, the motor ECU 72 advances the processing to Step S24 after turning OFF all of the remaining contactors.

In Step S7, the motor ECU 72 sends a command to turn OFF the sub contactor 22s of the first power circuit 2 to the first battery ECU 74, and then advances the processing to Step S8. The first battery ECU 74 thereby turns OFF the sub contactor 22s.

Herein, when the sub contactor 22s turns OFF in accordance with the command, the first battery B1 is disconnected from the first power line 21n. In addition, when the first battery B1 is disconnected from the first power line 21n, since the electric charge of the second smoothing capacitor C2 of the voltage converter 5 (refer to FIG. 3), for example, is discharged to the discharge resistor 25 (refer to FIG. 1), the first circuit voltage V1 declines as shown at times t3 to 4 of FIG. 6. In addition, in the case of the sub contactor 22s not turning OFF in accordance with the command, the first circuit voltage V1 almost does not decline. It should be noted that, since the second battery B2 is connected to the second smoothing capacitor C2 via the voltage converter 5, the first circuit voltage V1 will not become lower than the static voltage of the first battery B1. However, during system operation in the above way, since a state in which the static voltage of the first battery B1, i.e. first circuit voltage V1, is higher by at least the potential difference dV, more specifically at least the determination potential difference, than the static voltage of the second battery B2 is maintained, the first circuit voltage V1 declines by at least the determination potential difference from the voltage immediately before turning OFF the sub contactor 22s so long as the sub contactor 22s is turned OFF in accordance with the command.

In Step S8, the motor ECU 72 determines whether the first circuit voltage V1 has declined by at least the determination potential difference from the voltage immediately before first turning OFF the sub contactor 22s. In the case of the determination result of Step S8 being NO, the motor ECU 72 advances the processing to Step S9. In Step S9, the motor ECU 72 determines whether a predetermined time has elapsed since first turning OFF the sub contactor 22s. In the case of the determination result of Step S9 being NO, the motor ECU 72 returns the processing to Step S8.

In the case of the determination result of Step S9 being YES, i.e. case of the first circuit voltage V1 not declining by at least the determination potential difference even when a predetermined time elapsed, the motor ECU 72 advances the processing to Step S22, determines that the sub contactor 22s has welding failure, and then advances the processing to Step S23. In addition, in Step S23, the motor ECU 72 advances the processing to Step S24 after turning OFF all of the remaining contactors.

In the case of the determination result of Step S8 being YES, i.e. case of the first circuit voltage V1 declining by at least the determination potential difference before the predetermined time elapsed, the motor ECU 72 determines that the sub contactor 22s is normal, more specifically, the sub contactor 22s does not have welding failure, and then advances the processing to Step S10. In Step S10, the motor ECU 72 sends a command to turn OFF the pre-charge contactor 22p of the first power circuit 2 to the first battery ECU 74, and then advances the processing to Step S11. The first battery ECU 74 thereby turns OFF the pre-charge contactor 22p, and the first battery B1 is thereby disconnected from the first power line 21p, 21n.

In Step S11, the motor ECU 72 executes quick discharge processing to discharge the electrical charge of the second smoothing capacitor C2, until the first circuit voltage V1 and second circuit voltage V2 become equal, and then advances the processing to Step S12. In this quick discharge processing, the motor ECU 72 causes the electrical charge of the second smoothing capacitor C2 to quickly discharge, by performing switching control of the power converter 43 and flowing electrical current to the discharge resistor 25, for example. The first circuit voltage V1 thereby declines as shown at times t4 to t5 of FIG. 6.

In Step S12, the motor ECU 72 sends a command to turn OFF the main contactor 32m of the second power circuit 3 to the second battery ECU 75, and then advances the processing to Step S13. The second battery ECU 74 thereby turns OFF the main contactor 32m.

Herein, when the main contactor 32m turns OFF in accordance with the command, the second battery B2 is disconnected from the second power line 31p. In addition, when the second battery B2 is disconnected from the second power line 31p, since the electrical charge of the first smoothing capacitor C1 and second smoothing capacitor C2 of the voltage converter 5 (refer to FIG. 3) is discharged to the discharge resistor 25 (refer to FIG. 1), for example, the first circuit voltage V1 declines as shown at times t5 to t6 of FIG. 6. In addition, in the case of the main contactor 32m not turning OFF in accordance with the command, the first circuit voltage V1 almost does not decline. It should be noted that, in the above-mentioned Step S11, the electrical charge of the second smoothing capacitor C2 is made to discharge until the first circuit voltage V1 and second circuit voltage V2 become equal by executing the quick discharge processing. For this reason, so long as the main contactor 23m turns OFF in accordance with the command, the electrical charge of the first smoothing capacitor C1 and second smoothing capacitor C2 will be discharged to the discharge resistor 25 provided to the side of the first power circuit 2.

In Step S13, the motor ECU 72 determines whether the first circuit voltage V1 has declined by at least the determination potential difference from the voltage immediately before first turning OFF the main contactor 32m. In the case of the determination result of Step S13 being NO, the motor ECU 72 advances to Step S14. In Step S14, the motor ECU 72 determines whether a predetermined time has elapsed since first turning OFF the main contactor 32m. In the case of the determination result of Step S14 being NO, the motor ECU 72 returns the processing to Step S13.

In the case of the determination result of Step S14 being YES, i.e. the case of the first circuit voltage V1 not declining by at least the determination potential difference even when the predetermined time elapsed, the motor ECU 72 advances the processing to Step S22, determines that the main contactor 32m has welding failure, and advances the processing to Step S23. In addition, in Step S23, the motor ECU 72 advances the processing to Step S24 after turning OFF all of the remaining contactors.

In the case of the determination result of Step S13 being YES, i.e. the case of the first circuit voltage V1 having declined by at least the determination potential difference before the predetermined time elapsed, the motor ECU 72 determines that the main contactor 32m is normal, more specifically, the main contactor 32m does not have welding failure, and advances the processing to Step S15.

In Step S15, the motor ECU 72 sends a command to turn ON the pre-charge contactor 32p of the second power circuit 3 to the second battery ECU 75, and then advances the processing to Step S16. The second battery ECU 75 thereby turns ON the pre-charge contactor 32p.

Herein, when the pre-charge contactor 32p turns ON in accordance with the command, the second battery B2 is connected to the second power line 31p again. In addition, when the second battery B2 is connected to the second power line 31p, since the second smoothing capacitor C2 and first smoothing capacitor C1 of the voltage converter 5 are charged, the first circuit voltage V1 rises as shown at times t6 to t7 of FIG. 6. In addition, in the case of the pre-charge contactor 32p not turning OFF in accordance with the command, the first circuit voltage V1 almost does not rise.

In Step S16, the motor ECU 72 determines whether the first circuit voltage V1 has risen by at least the determination potential difference from the voltage immediately before first turning ON the pre-charge contactor 32p. In the case of the determination result of Step S16 being NO, the motor ECU 72 advances the processing to Step S17. In Step S17, the motor ECU 72 determines whether the predetermined time has elapsed since first turning ON the pre-charge contactor 32p. In the case of the determination result of Step S17 being NO, the motor ECU 72 returns the processing to Step S16.

In the case of the determination result of Step S17 being YES, i.e. the case of the first circuit voltage V1 not having risen by at least the determination potential difference even when the predetermined time elapsed, the motor ECU 72 advances the processing to Step S22, determines that the pre-charge contactor 32p has disconnect failure, and then advances the processing to Step S23. In addition, in Step S23, the motor ECU 72 advances the processing to Step S24 after turning OFF all of the remaining contactors.

In Step S18, the motor ECU 72 sends a command to turn OFF the sub contactor 32s of the second power circuit 3 to the second battery ECU 75, and then advances the processing to Step S19. The second battery ECU 75 thereby turns OFF the sub contactor 32s.

Herein, when the sub contactor 32s turns OFF in accordance with the command, the second battery B2 is disconnected from the second power line 31n. In addition, when the second battery B2 is disconnected from the second power line 31n, since the electrical charge of the first smoothing capacitor C1 and second smoothing capacitor C2 of the voltage converter 5 (refer to FIG. 3) is discharged to the discharge resistor 25 (refer to FIG. 1), for example, the first circuit voltage V1 declines as shown at times t7 to t8 of FIG. 6. In addition, in the case of the sub contactor 32s not turning OFF in accordance with the command, the first circuit voltage V1 almost does not decline.

In Step S19, the motor ECU 72 determines whether the first circuit voltage V1 has declined by at least the determination potential difference from the voltage immediately before first turning OFF the sub contactor 32s. In the case of the determination result of Step S19 being NO, the motor ECU 72 advances the processing to Step S20. In Step S20, the motor ECU 72 determines whether the predetermined time has elapsed since first turning OFF the sub contactor 32s. In the case of the determination result of Step S20 being NO, the motor ECU 72 returns the processing to Step S19.

In the case of the determination result of Step S20 being YES, i.e. the case of the first circuit voltage V1 not declining by at least the determination potential difference even when the predetermined time elapsed, the motor ECU 72 advances the processing to Step S22, determines that the sub contactor 32s has welding failure, and then advances the processing to 32s. In addition, in Step S23, the motor ECU 72 advances the processing to Step S24 after turning OFF all of the remaining contactors.

In the case of the determination result of Step S19 being YES, i.e. the case of the first circuit voltage V1 declining by at least the determination potential difference before the predetermined time elapsed, the motor ECU 72 determines that the sub contactor 32s is normal, more specifically, the sub contactor 32s does not have welding failure, and then advances the processing to Step S21. In Step S21, the motor ECU 72 sends a command to turn OFF the pre-charge contactor 32p of the second power circuit 3 to the second battery ECU 75, and then advances the processing to Step S24. The second battery ECU 75 thereby turns OFF the pre-charge contactor 32p, and the second battery B2 is thereby disconnected from the second power lines 31p, 31n.

In Step S24, the motor ECU 72 executes quick discharge processing to cause the electrical charge of the first smoothing capacitor C1 and second smoothing capacitor C2 to discharge until the first circuit voltage V1 becomes no more than a predetermined voltage decided in advance, and then ends the system interruption processing of FIGS. 5A and 5B. In this quick discharge processing, the motor ECU 72 causes the electrical charge of the first smoothing capacitor C1 and second smoothing capacitor C2 to quickly discharge, by performing switching control of the power converter 43, and flowing electrical current to the discharge resistor 25, for example. As shown at time t8 and later of FIG. 6, the first circuit voltage V1 thereby declines.

According to the above such power supply system 1, the following effects are exerted.

(1) With the power supply system 1, the first power lines 21p, 21n to which the first battery B1 is connected via the contactors 22m, 2s, 22p, and the second power lines 31p, 31n to which the second battery B2 is connected via the contactors 32m, 32s, 32p are connected via the voltage converter 5. In addition, the motor ECU 72, during system interruption, determines the existence of failure of the contactors 22m, 22s, 22p, 32m, 32s, 32p based on the change in first circuit voltage V1, which is the voltage of the second smoothing capacitor C2 connected to the first power line 21p, 21n. In addition, the management ECU 71 and contactor ECU 73, during system operation, operate the voltage converter 5 so that a state in which the static voltage of the first battery B1 is higher by at least the determination potential difference than the static voltage of the second battery B2 is maintained. Since it is thereby possible to ensure the potential difference between the static voltage of the first battery B1 and the static voltage of the second battery B2 is always at least the determination potential difference, during system interruption, the system interruption processing can appropriately determine the existence of failure of the contactors 22m, 22s, 22p, 32m, 32s, 32p. In addition, by always ensuring the above-mentioned potential difference during system operation, in the case of a command to interrupt the power supply system 1 being produced, it is possible to immediately start determination of failure of the contactors 22m, 22s, 22p, 32m, 32s, 32p.

(2) In the power supply system 1, the second battery is connected to the power converter and drive motor via the voltage converter. For this reason, when trying to supply electric power to the power converter and drive motor from the second battery, since a loss in the voltage converter occurs, the electric power demanded in the power converter and drive motor is preferably supplied from the first battery as much as possible in order to reduce the loss in the power supply system overall. However, if continuously preserving the output of electric power of the second battery, the potential difference between the static voltage of the first battery and the static voltage of the second battery will reduce, and during system interruption, there is concern over no longer being able to appropriately determine the existence of failure of the first and second contactors by the failure determination processing. In the power supply system 1, the management ECU 71 and converter ECU 73, in the case of the static voltage of the first battery B1 becoming no more than the empty level specified within the working voltage range thereof during system operation, operates the voltage converter 5 so that more electric power is outputted from the second battery B2 than the first battery B1. In addition, in the power supply system 1, the above-mentioned empty level is made at least the determination potential difference higher than the upper limit of the working voltage range for the static voltage of the second battery B2. Therefore, according to the power supply system 1, when the static voltage of the first battery B1 is higher than the empty level, in the case of the static voltage of the first battery B1 becoming no more than the empty level, while driving the power converter 43 and drive motor M by the electric power outputted from the first battery B1 so that the loss in the power supply system 1 overall becomes smaller, the voltage converter 5 is operated so that more electric power is outputted from the second battery B2 than the first battery B1, so as to be able to secure the potential difference between the static voltage of the first battery B1 and the static voltage of the second battery B2 of at least the determination potential difference during system interruption. It is thereby possible to appropriately determine the existence of failure of the contactors 22m, 22s, 22p, 32m, 32s, 32p by the system interruption processing, while making the loss of the power supply system 1 overall as small as possible during system operation.

(3) In the power supply system 1, the first battery B1 has lower output weight density and higher energy weight density than the second battery B2. In other words, the power supply system 1 uses a battery of capacity type as the first battery B1, and uses a battery of output type as the second battery B2. In addition, in the power supply system 1, the second battery B2 which is of output type is connected to the power converter 43 and drive motor M via the voltage converter 5. With such a power supply system 1, it is often the case that, during low load travel in which the electric power demanded by the power converter 43 and drive motor M is relatively small, the electric power is mainly outputted from the first battery B1 while preserving the second battery B2, so that the loss of the power supply system 1 overall becomes as small as possible, and during high load travel in which the electrical output demanded by the power converter 43 and drive motor M is relatively large, electric power is outputted from both the first battery B1 and second battery B2. In addition, in this case, the charge rate of the second battery B2 during system operation is often maintained in the vicinity of the upper limit thereof, so as to be able to output electric power according to the demand from the second battery B2 during high load travel. In this way, with the power supply system 1, since the charge rate of the second battery B2 of output type is maintained relatively high, the static voltage of the second battery B2 and the static voltage of the first battery B1 tend to approach each other. In contrast, the management ECU 71 and converter ECU 73 of the power supply system 1 operate the voltage converter 5 so that a state in which the static voltage of the first battery B1 is at least the determination potential difference higher than the static voltage of the second battery B2 is maintained during system operation. It is thereby possible to cause the electric power according to demand to be outputted from the second battery B2 during high load travel, while making the loss of the power supply system 1 overall as small as possible, and further, to appropriately determine the existence of failure of the contactors 22m, 22s, 22p, 32m, 32s, 32p by the system interruption processing.

Although an embodiment of the present invention has been explained above, the present invention is not to be limited thereto. The configuration of detailed parts may be modified as appropriate within the scope of the gist of the present invention.

For example, in the above-mentioned embodiment, the management ECU 71 and converter 73 operate the voltage converter 5 so that a state in which the static voltage of the first battery B1 is at least the determination potential difference higher than the static voltage of the second battery B2 is always maintained during system operation; however, the present invention is not limited thereto. It is sufficient for the above-mentioned potential difference to be secured until before determining failure of the contactors 22m, 22s, 22p during execution of the system interruption processing at the latest. For this reason, the management ECU 71 and converter ECU 73 may be configured so as to, in the case of the static voltage of the first battery B1 not being higher by at least the determination potential difference than the static voltage of the second battery B2 when starting system interruption processing, for example, supply electric power of the second battery B2 to the first battery B1, for example, before starting determination of failure of the contactors 22m, 22s, 22p, so that the static voltage of the first battery B1 becomes higher by at least the determination potential difference than the static voltage of the second battery B2, by charging the first battery B1.

What is claimed is:

1. A power supply system comprising:
    a first power line to which a first electric energy storage device is connected via a first contactor;
    a second power line to which a second electric energy storage device is connected via a second contactor;
    a voltage converter which converts voltage between the first power line and the second power line;
    a power converter which converts electric power between the first power line and a drive motor;
    a controller which operates the voltage converter;
    a capacitor which is connected to the first power line; and
    a failure determination device which executes failure determination processing of determining an existence of failure of the first contactor and the second contactor based on a change in voltage of the capacitor during system interruption,
    wherein the controller operates the voltage converter so that voltage of the first electric energy storage device becomes higher by at least a predetermined determination potential difference than voltage of the second electric energy storage device, until before the failure determination device starts the failure determination processing at latest.

2. The power supply system according to claim 1, wherein the controller operates the voltage converter so that a state in which static voltage of the first electric energy storage device is higher by at least the predetermined potential difference than static voltage of the second electric energy storage device is maintained during system operation.

3. The power supply system according to claim 2,
wherein an upper limit of a first working range for the static voltage of the first electric energy storage device is higher than an upper limit of a second working range for the static voltage of the second electric energy storage device,
wherein the controller operates the voltage converter so that more electric power is outputted from the second electric energy storage device than the first electric energy storage device, in a case of the static voltage of the first electric energy storage device becoming no more than a predetermined voltage specified within the first working range, during system operation, and
wherein the predetermined voltage is higher by at least the determination potential difference than the upper limit of the second working range.

4. The power supply system according to claim 2, wherein the first electric energy storage device has a lower output weight density and a higher energy weight density than the second electric energy storage device.

5. The power supply system according to claim 3, wherein the first electric energy storage device has a lower output weight density and a higher energy weight density than the second electric energy storage device.

* * * * *